US010168727B2

(12) United States Patent  
Lin

(10) Patent No.: US 10,168,727 B2  
(45) Date of Patent: Jan. 1, 2019

(54) ADAPTIVE LOW-DROPOUT REGULATOR HAVING WIDE VOLTAGE ENDURANCE RANGE, CHIP AND TERMINAL

(71) Applicant: VANCHIP (TIANJIN) TECHNOLOGY CO., LTD., Tianjin (CN)

(72) Inventor: Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 15/551,307

(22) PCT Filed: Jan. 12, 2016

(86) PCT No.: PCT/CN2016/070728  
§ 371 (c)(1),  
(2) Date: Aug. 16, 2017

(87) PCT Pub. No.: WO2016/131354  
PCT Pub. Date: Aug. 25, 2016

(65) Prior Publication Data  
US 2018/0067512 A1  Mar. 8, 2018

(30) Foreign Application Priority Data

Feb. 17, 2015  (CN) .......................... 2015 1 0086281

(51) Int. Cl.  
*G05F 1/595* (2006.01)  
*G05F 3/30* (2006.01)  
(Continued)

(52) U.S. Cl.  
CPC ................ *G05F 3/30* (2013.01); *G05F 1/575* (2013.01); *G05F 3/222* (2013.01); *G11C 5/147* (2013.01); *H03F 1/086* (2013.01); *H03F 3/217* (2013.01)

(58) Field of Classification Search  
CPC ........... G05F 1/575; G05F 1/565; G05F 3/262  
(Continued)

(56) References Cited

U.S. PATENT DOCUMENTS 6,373,233 B2 * 4/2002 Bakker .................... G05F 1/575  
                                                                   323/282  
6,465,994 B1 * 10/2002 Xi ........................... G05F 1/575  
                                                                  323/274  
(Continued)

FOREIGN PATENT DOCUMENTS

CN         101329587 A     12/2008  
CN         101364119 A      2/2009  
(Continued)

*Primary Examiner* — Rajnikant Patel  
(74) *Attorney, Agent, or Firm* — Mark M. Friedman

(57) ABSTRACT

An adaptive low-dropout regulator (LDO) having a wide voltage endurance range includes a power supply voltage tracker (P1), a voltage-current converter (101), an error amplifier (201), a current mirror circuit (102), and a dynamic voltage divider (103). One end of the power supply voltage tracker (P1) is connected to a $V_{dd}$, the other end thereof is connected to the voltage-current converter (101) connected to an input end of the current mirror circuit (102), and an output end of the current mirror circuit (102) is connected to sources of two input field effect transistors (N3, N4) in the error amplifier (201). Sources of two load field effect transistors (P2, P3) in the error amplifier (201) are connected to the $V_{dd}$. Dynamic voltage dividers (103A, 103B) are connected respectively between each of the input field effect transistors (N3, N4) and the corresponding load field effect transistors (P2, P3).

11 Claims, 3 Drawing Sheets

(51) Int. Cl.
*H03F 3/217* (2006.01)
*G05F 1/575* (2006.01)
*G05F 3/22* (2006.01)
*G11C 5/14* (2006.01)
*H03F 1/08* (2006.01)

(58) Field of Classification Search
USPC ....... 323/222, 266, 269, 270, 273–276, 279, 323/282, 303, 314
See application file for complete search history.

(56) References Cited

U.S. PATENT DOCUMENTS

| | | | | |
|---|---|---|---|---|
| 6,522,111 | B2 * | 2/2003 | Zadeh | G05F 1/575 |
| | | | | 323/277 |
| 6,664,853 | B1 * | 12/2003 | Sun | H03F 3/45197 |
| | | | | 330/252 |
| 6,703,813 | B1 * | 3/2004 | Vladislav | G05F 1/575 |
| | | | | 323/270 |
| 7,402,987 | B2 * | 7/2008 | Lopata | G05F 1/575 |
| | | | | 323/280 |
| 7,492,137 | B2 | 2/2009 | Yamada | |
| 7,932,707 | B2 | 4/2011 | Imura | |
| 8,680,829 | B2 | 3/2014 | Giroud | |
| 2010/0264987 | A1 | 10/2010 | Yuasa | |

FOREIGN PATENT DOCUMENTS

| | | |
|---|---|---|
| CN | 102063146 A | 5/2011 |
| CN | 102279612 A | 12/2011 |
| CN | 202067171 U | 12/2011 |
| CN | 102789257 A | 11/2012 |
| CN | 102945059 A | 2/2013 |
| CN | 104808734 A | 7/2015 |
| EP | 2151732 B1 | 10/2012 |
| JP | 2006318327 A | 11/2006 |
| JP | 2007257104 A | 10/2007 |
| JP | 2010004258 A | 1/2010 |

* cited by examiner

ADAPTIVE LOW-DROPOUT REGULATOR HAVING WIDE VOLTAGE ENDURANCE RANGE, CHIP AND TERMINAL

BACKGROUND

Technical Field

The present invention relates to a low-dropout regulator (LDO), and in particular, to an adaptive low-dropout regulator having a wide voltage endurance range, and an integrated circuit chip and a communications terminal that use the adaptive low-dropout regulator, and belongs to the field of integrated circuit technologies.

Related Art

With constant improvement of process integration of integrated circuits, endurance levels of circuit units are becoming lower. For example, generally, for a circuit unit in a 0.18 μm integrated circuit process, the voltage endurance value is approximately 2.5 V. In a battery powered system, a power supply voltage is usually kept between 3 V and 5 V or even higher. Therefore, in a high voltage system, if a low voltage circuit without being specially designed and processed is directly used, the circuit may be burnt.

A low-dropout regulator is usually used in a power management system, and is generally directly powered by a power supply voltage. The function of the LDO is to adjust the power supply voltage to a suitable voltage range of an internal chip. As is known to all, generally, a constant bias current is provided for an amplifier in the low-dropout regulator, so that a gain and a speed of the amplifier are kept substantially constant. However, with a constant increase in the power supply voltage, voltages at a source and a drain of a transistor reach or exceed nominal voltage endurance values of the transistor. Consequently, the transistor may be burnt.

Referring to FIG. 1, a conventional low-dropout regulator is usually implemented as an operational amplifier (OTA) including five transistors. A bias current I_b is constant, and a node voltage $V_{com}$ is kept substantially unchanged. However, with an increase in a power supply voltage $V_{dd}$, the bias current is constant, and it may be learned that a bias voltage difference of a PMOS transistor M4 is kept unchanged. Therefore, a node voltage $V_{bp}$ increases with the power supply voltage. In this way, a voltage difference $V_{ds\_pair}$ between a source and a drain of each of pair input transistors M1 and M2 may be calculated by using Formula (1):

$$V_{ds\_pair} = V_{dd} - V_{bp} - V_{com} = V_{dd} - |V_{tp}| - V_{dsat} \approx V_{dd} - 1.1V \qquad (1)$$

$V_{tp}$ is a turn-on voltage of a PMOS transistor. It is assumed that $|V_{tp}|=V_{tn}=0.7$ V, and saturation voltages at a source and a drain of a current mirror transistor 102B are $V_{dsat}=0.4$ V. As can be learned from Formula (1), the voltage difference $V_{ds\_pair}$ between the source and the drain of each of the pair input transistors M1 and M2 changes with the power supply voltage $V_{dd}$, and a change amplitude is basically the same as that of $V_{dd}$. Further, as can be known from Formula (1), using a nominal secure voltage endurance value 2.5 V in a 0.18 μm process as an example, a circuit needs to be designed to ensure that $V_{ds\_pair}$ cannot exceed the secure voltage endurance value 2.5 V of a transistor. In this way, it may be deduced that $V_{dd}$ cannot exceed 3.6 V. Therefore, 3.6 V is an upper limit of a power supply voltage ensuring that a circuit in FIG. 1 securely works. The upper limit is far from satisfying an application requirement of a 5 V system power supply voltage.

Therefore, how to enable, by using a proper circuit design, a circuit manufactured by a low voltage process component to work in a power supply voltage that is much higher than a nominal voltage of the process component is a current challenge of designing a low-dropout regulator circuit.

SUMMARY

Based on the disadvantages in the prior art, a primary technical problem that needs to be resolved in the present invention is providing an adaptive low-dropout regulator having a wide voltage endurance range in a low voltage process situation.

Another technical problem to be resolved in the present invention is providing an integrated circuit chip and a communications terminal that use the foregoing adaptive low-dropout regulator.

To achieve the foregoing objectives, technical solutions used in the present invention are as follows:

According to a first aspect of the embodiments of the present invention, an adaptive low-dropout regulator having a wide voltage endurance range is provided, including: a power supply voltage tracker, a voltage-current converter, an error amplifier, a current mirror circuit, and a dynamic voltage divider, where one end of the power supply voltage tracker is connected to a power supply voltage, the other end thereof is connected to the voltage-current converter, and the power supply voltage tracker is configured to change with the power supply voltage;

the voltage-current converter converts a changed voltage of the power supply voltage tracker into a changed current, and inputs the current to the current mirror circuit as a reference current;

an output end of the current mirror circuit is connected to sources of two input field effect transistors in the error amplifier, and is configured to provide a bias current;

sources of two load field effect transistors in the error amplifier are connected to the power supply voltage; and the dynamic voltage divider is connected between each of the input field effect transistors and a corresponding load field effect transistor, to dynamically withstand a voltage drop applied by the power supply voltage to the error amplifier.

Preferably, the power supply voltage tracker is implemented as a PMOS transistor, a source of the PMOS transistor is connected to the power supply voltage, and a drain thereof is connected to a gate and the voltage-current converter.

Preferably, the voltage-current converter is implemented as a dynamic current source.

Preferably, the voltage-current converter is implemented as a resistor.

Preferably, a voltage drop between two ends of the dynamic voltage divider linearly changes with a current of the dynamic voltage divider.

Preferably, the dynamic voltage divider is implemented as a resistance voltage divider.

Preferably, the current mirror circuit mirrors the reference current to the error amplifier according to a mirror multiple.

Preferably, when the reference current is given, a maximum voltage endurance value of the low-dropout regulator is determined by a product of a parameter value of the dynamic voltage divider and a mirror multiple of the current mirror circuit.

Preferably, a parameter of the voltage-current converter is obtained according to the reference current and the maximum voltage endurance value of the low-dropout regulator.

According to a second aspect of the embodiments of the present invention, an integrated circuit chip is provided, where the integrated circuit chip uses the foregoing adaptive low-dropout regulator.

According to a third aspect of the embodiments of the present invention, a communications terminal is provided, where the communications terminal uses the foregoing adaptive low-dropout regulator.

The adaptive low-dropout regulator provided in the present invention can automatically change a bias condition with a power supply voltage, dynamically adjust a voltage endurance range of a field effect transistor in an error amplifier, and ensure that voltage differences between different ports of all field effect transistors do not exceed a nominal voltage value, so that the product can be finally applied to a system or a chip with a voltage higher than a nominal power supply voltage.

DETAILED DESCRIPTION

Technical content of the present invention is described below in detail with reference to the accompanying drawings and specific embodiments.

Figure 1:
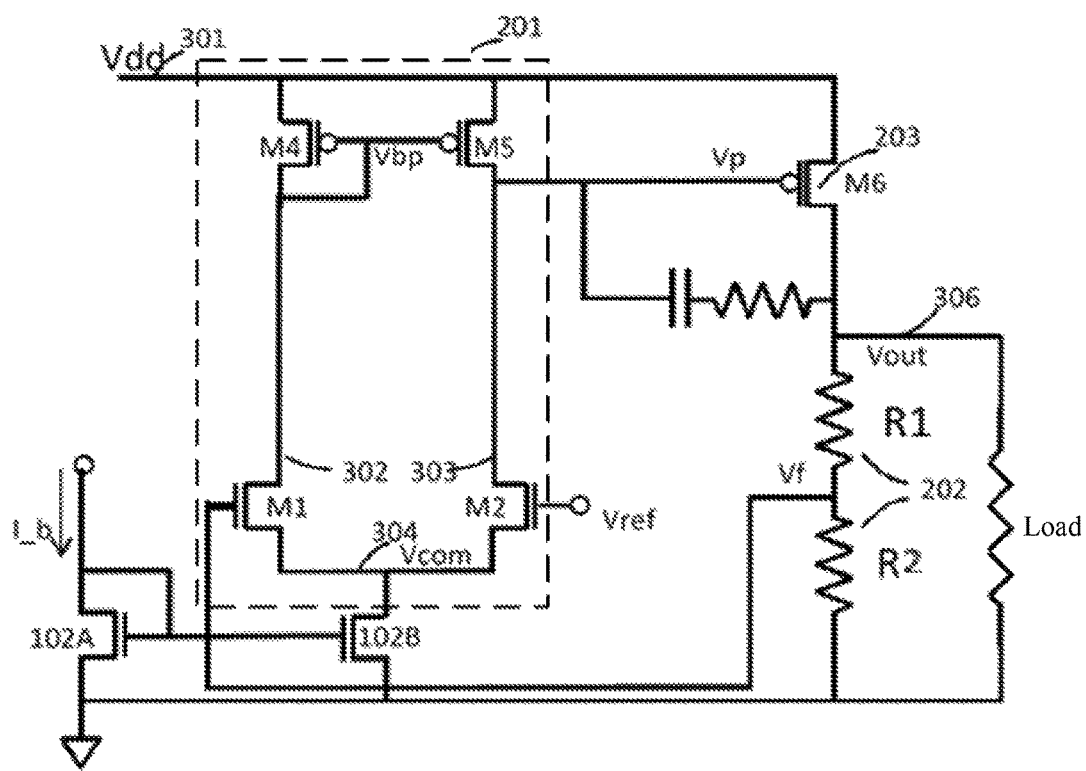
FIG. 1 is a circuit principle diagram of a conventional low-dropout regulator.

Referring to FIG. 1, a conventional low-dropout regulator includes: a reference voltage $V_{ref}$, an error amplifier, a feedback line, and a through element. The through element (203) is one of cores of the LDO, and usually includes a PMOS transistor. A source of the PMOS transistor M6 is directly connected to a power supply voltage $V_{dd}$, a gate thereof is connected to an output end Vp of the error amplifier (201), and a drain thereof is an output end $V_{out}$ (306) of the LDO. A parallel path connecting a load and the feedback circuit exists between the drain and a ground. A compensation circuit for frequency compensation exists between the drain and the gate. The compensation circuit includes a Miller capacitor and a resistor. The feedback circuit uses two resistors R1 and R2 in series. A voltage at a connection point between the two resistors is a feedback voltage $V_{ref}$ at an input end of the error amplifier. The output end $V_{out}$ (306) of the error amplifier is isolated from the power supply voltage $V_{dd}$ (301) by using the through element (203). Therefore, a voltage value at the output end $V_{out}$ of the LDO is unrelated to a value of $V_{dd}$. $V_{out}$ depends on an input reference voltage $V_{ref}$ and values of R1 and R2 (202) on the feedback line. That is:

$$V_{out}=V_{ref}*(1+R1/R2) \quad (2)$$

Figure 2:
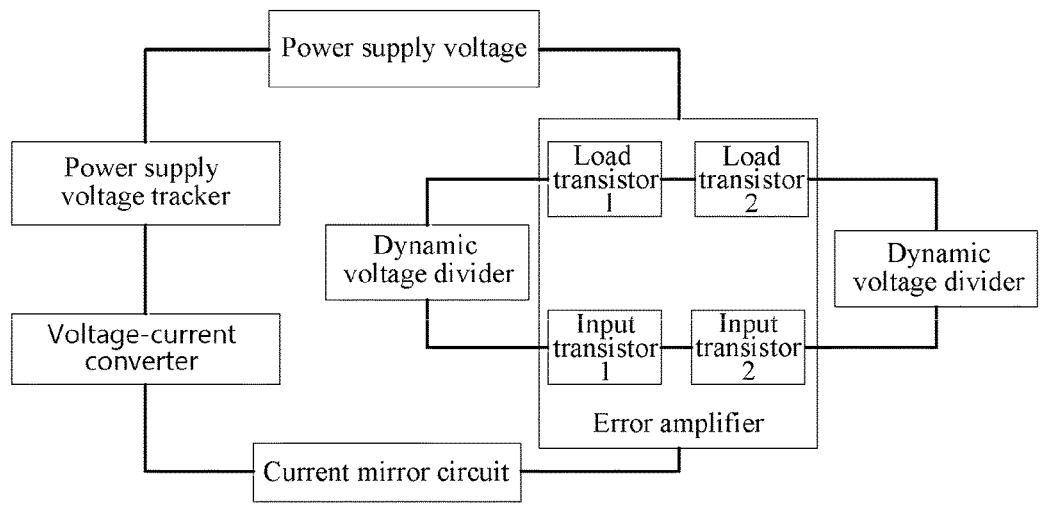
FIG. 2 is a structural block diagram of a principle of a low-dropout regulator according to the present invention.

Referring to FIG. 2, an adaptive low-dropout regulator having a wide voltage endurance range provided in the present invention is obtained by adding an adaptive dynamical adjustment circuit based on the conventional low-dropout regulator. The adaptive dynamical adjustment circuit includes a power supply voltage tracker, a voltage-current converter, a current mirror circuit, and dynamic voltage dividers. One end of the power supply voltage tracker is connected to a power supply voltage, the other end thereof is connected to the voltage-current converter, and the power supply voltage tracker is configured to change with the power supply voltage. The voltage-current converter is connected to an input end of the current mirror circuit, and is configured to convert the changed power supply voltage into a changed current. An output end of the current mirror circuit is connected to sources of two input field effect transistors in an error amplifier, and is configured to provide a bias current. Sources of two load field effect transistors in the error amplifier are connected to the power supply voltage. The dynamic voltage divider is connected between each of the input field effect transistors and a corresponding load field effect transistor, to dynamically withstand a voltage drop applied by the power supply voltage to the error amplifier.

When the low-dropout regulator works, the power supply voltage tracker changes with the power supply voltage $V_{dd}$. The voltage-current converter converts the changed voltage into a changed current. Then, the current is mirrored by the current mirror circuit to the error amplifier, and is used as a bias tail current of the error amplifier. The dynamic voltage dividers are connected in series between drains of pair input transistors and corresponding load transistors of the error amplifier. When the power supply voltage $V_{dd}$ increases, the dynamic voltage dividers divide the voltage drop caused by the increase in the power supply voltage $V_{dd}$, and a divided voltage is proportional to a change of the power supply voltage, thereby ensuring that voltage differences between different ports of all transistors in the error amplifier are kept within a secure nominal working voltage range specified by a process of the error amplifier.

Embodiment 1

Figure 3:
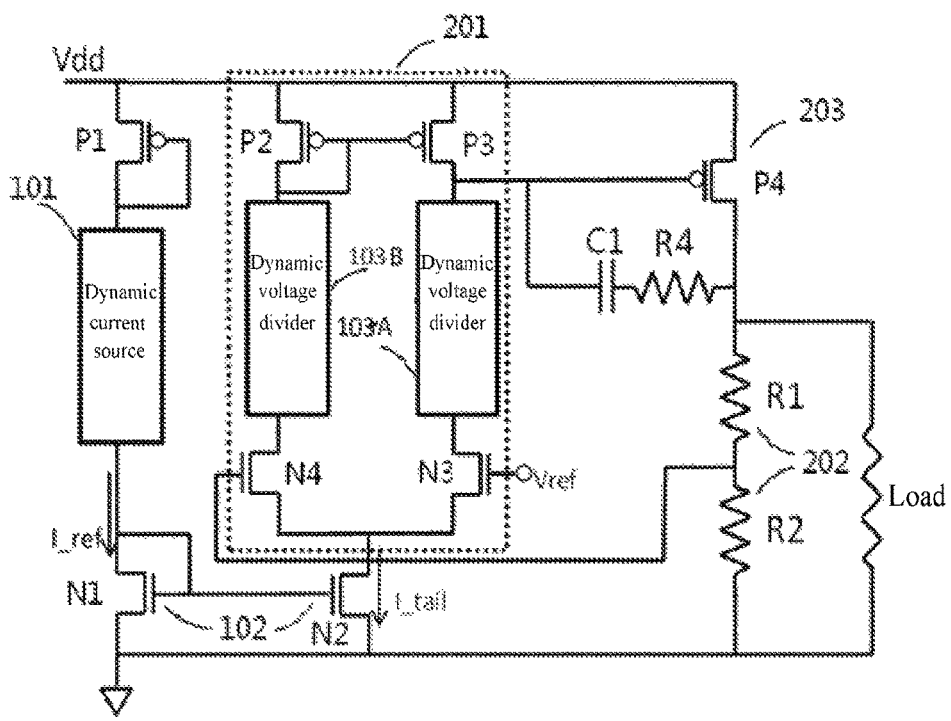
FIG. 3 is a circuit principle diagram of Embodiment 1 according to the present invention.
Figure 4:
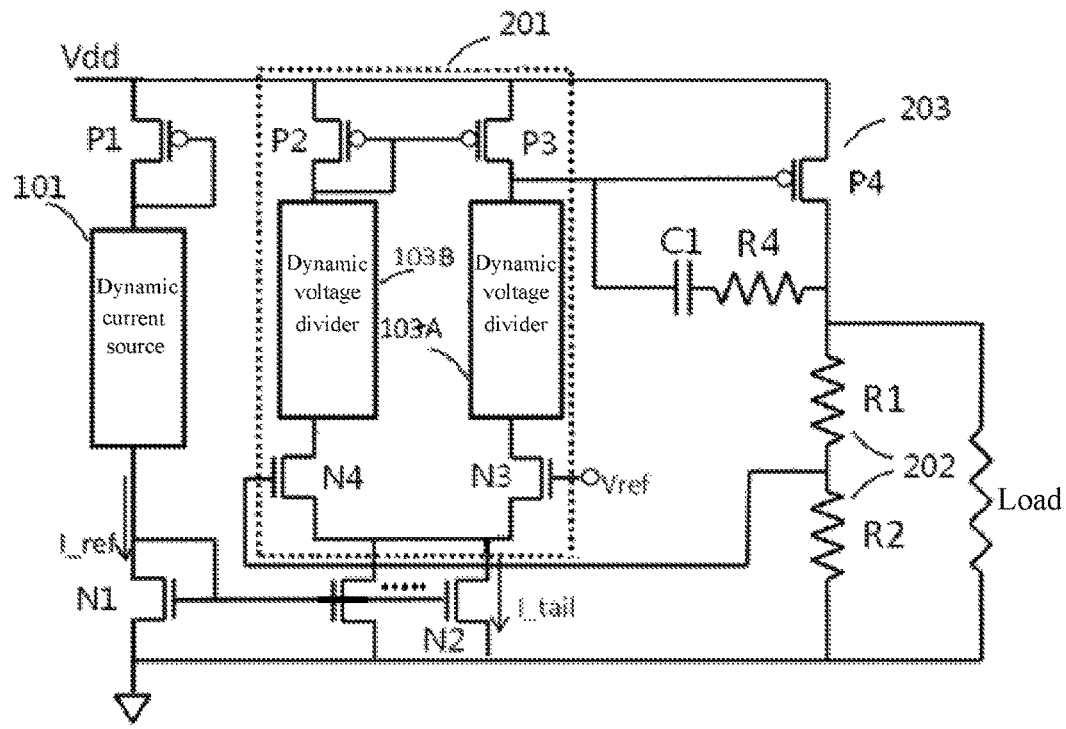
FIG. 4 is a circuit principle diagram of a current mirror circuit using a multilevel transistor according to Embodiment 1.

Referring to FIG. 3, an adaptive dynamical adjustment circuit includes a power supply voltage tracker, a dynamic current source 101, a current mirror circuit 102, and dynamic voltage dividers 103 (103A/103B). The power supply voltage tracker is implemented as a PMOS transistor P1, a source of the PMOS transistor P1 is connected to a power supply voltage, and a drain thereof is connected to a gate and the dynamic current source 101. In this embodiment, a voltage-current converter is the dynamic current source 101, and is configured to convert a change of the power supply voltage into a change of a current, and is located on a path on which a reference current is generated. In this embodiment, a simplest circuit structure is used for a current of the current mirror circuit 102. The circuit structure includes two NMOS transistors N1 and N2 whose gates are connected to each other. The gate of N1 is connected to a drain of N1, the drain is connected to the dynamic current source 101, and a source of N1 is grounded. A source of N2 is grounded, and a drain of N2 is connected to an error amplifier. Certainly, an output end of the current mirror circuit 102 may alternatively include multiple NMOS transistors that are connected in parallel. For details, refer to FIG. 4. The error amplifier amplifies and outputs a difference between two input signals. The error amplifier in the present invention includes two load PMOS transistors P2 and P3, and two input NMOS transistors N3 and N4. Sources of the two PMOS transistors P2 and P3 are connected to the power supply voltage $V_{dd}$, and gates thereof are connected to each other. A drain of P2 is connected to a gate of P2, and is connected to one end of the dynamic voltage divider 103B. A drain of P3 is connected to one end of the dynamic voltage divider 103A, and also serves as an output end of the error amplifier. Sources of the two NMOS transistors N3 and N4 are connected to the current mirror circuit 102. A gate of N3 serves as an input end of a feedback voltage, and a drain of N3 is connected to the other end of the dynamic voltage divider 103A. A gate of N4 is an input end of a preset reference voltage, and a drain of N4 is connected to the other end of the dynamic voltage divider 103B.

The two dynamic voltage dividers are respectively inserted between the drains of the pair input transistors (N3 and N4) of the error amplifier and the drains of the respective corresponding load transistors (N4 corresponds to P2, and N3 corresponds to P3). A value of a voltage divided by the dynamic voltage dividers 103 depends on a current passing through the dynamic voltage dividers 103. Therefore, a withstood voltage drop is proportional to a change of $I_{tail}$; and the change of $I_{tail}$ is a change of the power supply voltage. Therefore, the voltage divided by the dynamic voltage dividers 103 is proportional to the change of the power supply voltage. That is, the dynamic voltage dividers 103 can dynamically withstand the voltage drop applied by the power supply voltage to the error amplifier, so that voltage differences between different ports of transistors in the error amplifier are kept within a secure nominal working voltage range, thereby ensuring that the error amplifier can withstand a higher working voltage.

Embodiment 2

Figure 5:
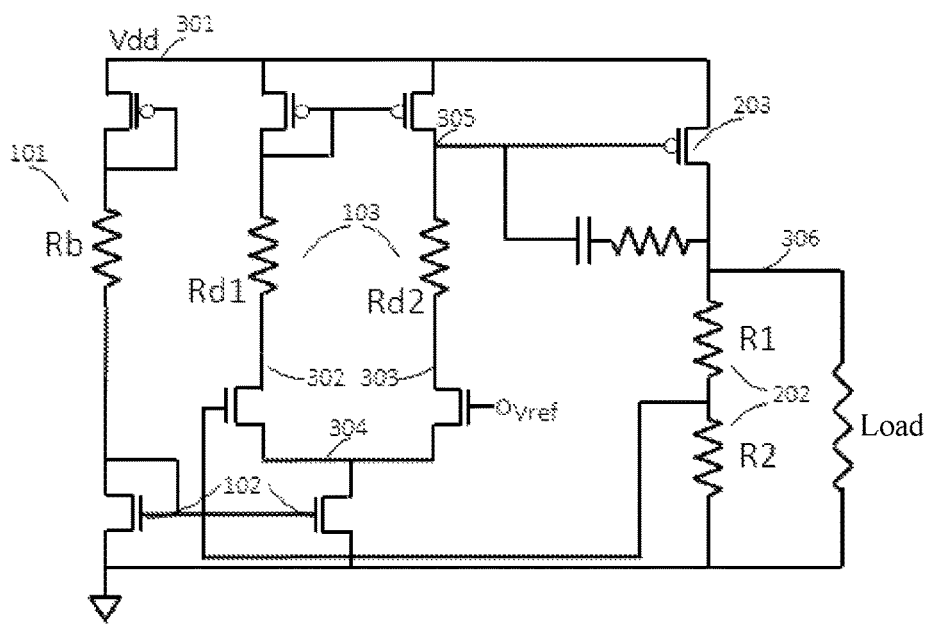
FIG. 5 is a circuit principle diagram of Embodiment 2 according to the present invention.

Referring to FIG. 5, this embodiment is further detailed based on Embodiment 1. A dynamic current source and dynamic voltage dividers are implemented as resistors. In FIG. 5, the dynamic current source is Rb, the dynamic voltage dividers are Rd1 and Rd2. How to select a proper element parameter to enable a linear regulator to have a wider voltage endurance range is described below with reference to the accompanying drawings and specific calculation processes.

The dynamic current source in this embodiment is Rb, and a current passing through Rb may be calculated by using the following formula:

$$I_{ref}=(V_{dd}-|V_{tp}|-V_{tn})/Rb \qquad (3)$$

A reference voltage $I_{ref}$ changes with a power supply voltage $V_{dd}$, and is transmitted to an error amplifier by way of a current mirror circuit, to serve as a bias current $I_{tail}$ of the error amplifier. Assuming that a mirror multiple of the current mirror circuit is N, that is, N2 is N times N1, $I_{tail}=N*I_{ref}$.

In this embodiment, the dynamic voltage dividers may be implemented as the resistors Rd1 and Rd2. Voltage drops at two ends of Rd1 and Rd2 linearly change with currents passing through Rd1 and Rd2. The following describes how to select the resistance value Rb of the dynamic current source, the mirror multiple of the current mirror circuit, and values of the resistors Rd1 and Rd2, that is, the dynamic voltage dividers, according to a voltage endurance value range required by a circuit.

First, it is assumed that $V_{dd}=3.6$ V is a critical value. That is, when $V_{dd}<3.6$ V, $V_{ds\_pair}<2.5$ V, that is, a voltage of a transistor will not exceed 2.5 V, and the circuit is normal. It is assumed in the following that a maximum voltage endurance value $V_{dd\_max}$ of the circuit needs to reach 5 V, it is set that $I_{ref}=10$ μA, and it is calculated according to Formula (3) that Rb=360 Kohm. That is, once a power supply voltage and a reference current are given, a value of the resistor Rb used for the dynamic current source 101 may be calculated according to Formula (3).

A mirror current $I_{tail}$ is calculated according to Formula (4).

$$I_{tail}=I_{ref}*N=10*N \text{ μA} \qquad (4)$$

A voltage drop $V_{Rd}$ on the dynamic voltage dividers 103 may be calculated according to Formula (5), where, it is assumed that Rd1=Rd2=Rd.

$$V_{Rd}=(I_{tail}/2)*Rd=5N*Rd \qquad (5)$$

To ensure that voltage differences $V_{d\_pair}$ between sources and drains of pair input transistors of the error amplifier do not exceed a nominal value, using 2.5 V as an example, the condition in Formula (6) needs to be satisfied.

$$V_{ds\_pair} \leq V_{nominal\ value} \qquad (6)$$

That is, $V_{dd\_max}-|V_{tp}|-V_{ds}-V_{Rd} \leq 2.5$ V.

Herein, $V_{dd\_max}$ represents a maximum power supply voltage allowed by the circuit, and it is further deduced that:

$$V_{Rd} \geq V_{dd\_max}-|V_{tp}|-V_{ds}-V_{nominal\ value} \geq V_{dd\_max}-|V_{tp}|-V_{ds}-2.5V \qquad (7)$$

$V_{tp}$ represents a turn-on voltage of a load transistor, and $V_{ds}$ represents saturation voltages at a source and a drain.

Assuming that the saturation voltages at the source and the drain is $V_{ds}=0.4$ V, Formula (5) is substituted into Formula (7) to obtain the following formula:

$$(I_{tail}/2)*Rd \geq V_{dd\_max}-|V_{tp}|-V_{ds}-V_{nominal\ value}$$

That is, $I_{ref}*N/2*Rd \geq V_{dd\_max}-|V_{tp}|-V_{ds}-V_{nominal\ value} \qquad (8)$ It is further obtained that N and Rd need to satisfy the constraint condition in Formula (9):

$$N*Rd \geq 2(V_{dd\_max}-|V_{tp}|-V_{ds}-V_{nominal\ value})/I_{ref} \qquad (9)$$

Assuming that $|V_{tp}|=V_{tn}=0.7$ V, $V_{ds}=0.4$ V, and N=1, it may be obtained that $$Rd \geq (V_{dd\_max}-3.6)/5=(5-3.6)/5=280 \text{ Kohm}$$

As can be learned from Formula (9), once the reference current is given, an upper limit V of a voltage endurance value that the circuit needs to reach can be adjusted only by changing a value of N*Rd. The voltage endurance value of the transistor is improved, so that the entire circuit can work in a power supply voltage that is higher than a nominal voltage endurance value, thereby satisfying a higher application requirement for the power supply voltage.

The present invention further discloses an integrated circuit chip. The integrated circuit chip features usage of the foregoing adaptive low-dropout regulator.

In addition, the foregoing adaptive low-dropout regulator may further be used in a communications terminal. The communications terminal herein may refer to computer devices that support multiple communications standards such as Wi-Fi, GSM, EDGE, TD_SCDMA, TDD_LTE, and FDD_LTE and that are used in a mobile environment, including, but not limited to, mobile phones, notebook computers, tablet computers, and in-vehicle computers. In addition, the adaptive low-dropout regulator is also applicable to another scenario to which a power management system is applied, for example, a communications base station supporting multiple communications standards.

In conclusion, according to the adaptive low-dropout regulator having a wide voltage endurance range provided in the present invention, a power supply voltage tracker, a voltage-current converter, and a dynamic regulator are added based on an original basic circuit, so that the circuit can automatically change a bias condition with an increase in a power supply voltage, and dynamically adjust and ensure that voltage differences between different ports of all transistors do not exceed a nominal voltage value of a process of the adaptive low-dropout regulator, thereby implementing a low-dropout regulator having a wide voltage endurance range. Therefore, a product can be applied to a system or a chip with a voltage higher than a nominal power supply voltage of a process of the product.

In the present invention, an upper limit that is of a power supply voltage and that is allowed by a circuit is increased by using a simple circuit design, thereby greatly widening a use range of a low voltage process in a high voltage environment. In addition, a chip area occupied by an extra element used in the present invention is small, thereby ensuring that a volume of an integrated circuit chip is not obviously increased.

The adaptive low-dropout regulator having a wide voltage endurance range, the chip, and the terminal that are provided in the present invention are described above in detail. Any obvious modification made by a person of ordinary skill in the art to the present invention without departing from the spirit of the present invention will constitute patent infringement of the present invention, and corresponding legal responsibilities shall be taken.

What is claimed is:

1. An adaptive low-dropout regulator having a wide voltage endurance range, comprising: a power supply voltage tracker, a voltage-current converter, an error amplifier, a current mirror circuit, and a dynamic voltage divider, wherein
    one end of the power supply voltage tracker is connected to a power supply voltage, the other end thereof is connected to the voltage-current converter, and the power supply voltage tracker is configured to change with the power supply voltage;
    the voltage-current converter converts a changed voltage of the power supply voltage tracker into a changed current, and inputs the current to the current mirror circuit as a reference current;
    an output end of the current mirror circuit is connected to sources of two input field effect transistors in the error amplifier, and is configured to provide a bias current;
    sources of two load field effect transistors in the error amplifier are connected to the power supply voltage; and
    the dynamic voltage divider is connected between each of the input field effect transistors and a corresponding load field effect transistor, to dynamically withstand a voltage drop applied by the power supply voltage to the error amplifier.

2. The adaptive low-dropout regulator according to claim 1, wherein
    the power supply voltage tracker is implemented as a PMOS transistor, a source of the PMOS transistor is connected to the power supply voltage, and a drain thereof is connected to a gate and the voltage-current converter.

3. The adaptive low-dropout regulator according to claim 1, wherein
    the voltage-current converter is implemented as a dynamic current source.

4. The adaptive low-dropout regulator according to claim 1, wherein
    the voltage-current converter is implemented as a resistor.

5. The adaptive low-dropout regulator according to claim 1, wherein
    a voltage drop between two ends of the dynamic voltage divider linearly changes with a current of the dynamic voltage divider.

6. The adaptive low-dropout regulator according to claim 5, wherein
    the dynamic voltage divider is implemented as a resistance voltage divider.

7. The adaptive low-dropout regulator according to claim 1, wherein
    the current mirror circuit mirrors the reference current to the error amplifier according to a mirror multiple.

8. The adaptive low-dropout regulator according to claim 1, wherein
    when the reference current is given, a maximum voltage endurance value of the low-dropout regulator is determined by a product of a parameter value of the dynamic voltage divider and a mirror multiple of the current mirror circuit.

9. The adaptive low-dropout regulator according to claim 8, wherein
    a parameter of the voltage-current converter is obtained according to the reference current and the maximum voltage endurance value of the low-dropout regulator.

10. An integrated circuit chip, using the adaptive low-dropout regulator according to claim 1.

11. A communications terminal, using the adaptive low-dropout regulator according to claim 1.

* * * * *